United States Patent [19]
Goodwin

[11] Patent Number: 5,751,049
[45] Date of Patent: May 12, 1998

[54] TWO-COLOR INFRARED DETECTOR

[75] Inventor: Michael W. Goodwin, Richardson, Tex.

[73] Assignee: Texas Instruments Incorporated, Dallas, Tex.

[21] Appl. No.: 305,639

[22] Filed: Sep. 14, 1994

Related U.S. Application Data

[63] Continuation-in-part of Ser. No. 128,977, Sep. 29, 1993, and Ser. No. 108,200, Aug. 16, 1993.

[51] Int. Cl.$^6$ .................................. H01L 27/14; H01L 31/00
[52] U.S. Cl. ........................... 257/440; 257/441; 257/443
[58] Field of Search ................................ 257/188, 226, 257/440, 443, 441

[56] References Cited

PUBLICATIONS

Blazejenski J Vac Sci Tech B 10(4) Jul./Aug. 1992 pp. 1626–1032.
Goodwin et al J Vac Sci Tech A vol. 18 No. 2 Mar./Apr. 1990 pp. 1226–1232.

*Primary Examiner*—Donald L. Monin, Jr.
*Attorney, Agent, or Firm*—Christopher L. Maginniss; James C. Kesterson; Richard L. Donaldson

[57] ABSTRACT

A two-color infrared detector (50) is provided comprising elements (10, 110, or 210) having one or more diodes (58, 158 and 168) and a metal insulator semiconductor ("MIS") device (56 and 156). The infrared detector (50) may be referred to as a vertically integrated capacitor diode. The diodes comprise regions (12, 14, 16, 112, 114, and 116) of semiconductor materials which are operable to generate electron-hole pairs when struck by infrared radiation (40) having first and second wavelengths. The capacitor (156) includes a gate (24) provided by the MIS device which is operable to generate a potential well in the first semiconductor region (12 and 112) in conjunction with an insulator layer (22) and collect charges generated by the first wavelength of infrared radiation (40). The layers of semiconductor material may be varied to enhance the performance of the resulting infrared detector.

28 Claims, 5 Drawing Sheets

TWO-BAND DETECTION

MID-WAVE READ-OUT

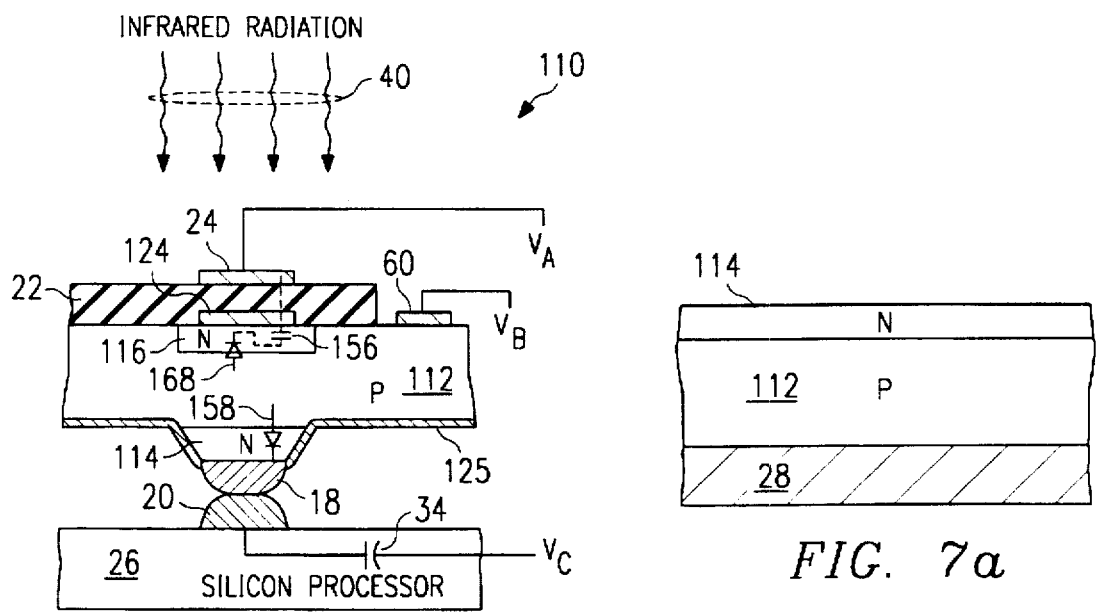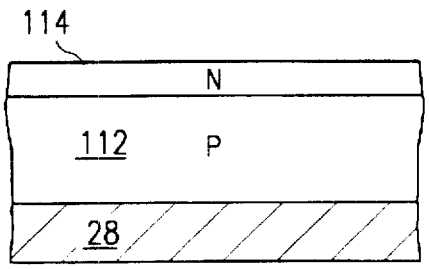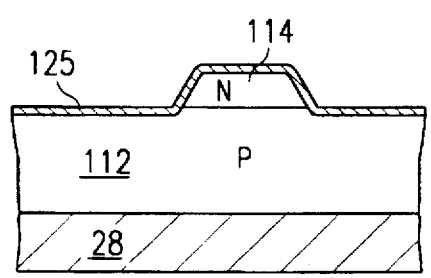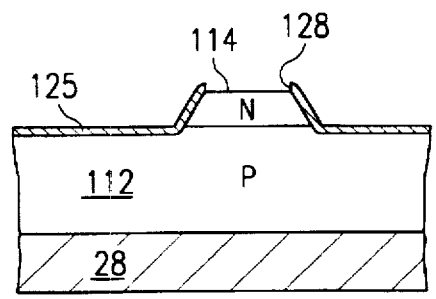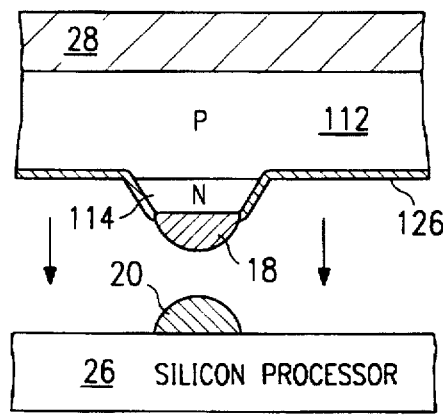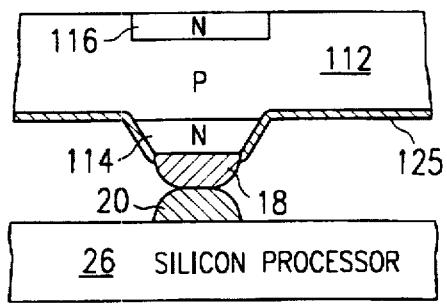

TWO-COLOR INFRARED DETECTOR

RELATED PATENT APPLICATION

This is a continuation-in-part of patent application U.S. Ser. No. 08/128,977 filed Sep. 29, 1993, entitled Two-Colored Infrared Detector and Method (Attorney's Docket TI-16720AAA), and patent application U.S. Ser. No. 08/108,200 filed Aug. 16, 1993, entitled Two-Color Infrared Detector and Method (Attorney's Docket TI-16720AA). Both applications are still pending.

TECHNICAL FIELD OF THE INVENTION

This invention relates in general to semiconductor devices and more particularly to a two-color infrared detector and method.

BACKGROUND OF THE INVENTION

For several years infrared detectors have been successfully incorporated into integrated circuits for mass production and miniaturization. Typically, such infrared detectors are fabricated in N×M arrays of infrared detectors or thermal sensors. Each element in the array may itself be fabricated from semiconductor materials such as alloys of mercury, cadmium, and tellurium ("HgCdTe") which are operable to generate electron-hole pairs when struck by infrared radiation. The particular wavelength from which each element generates electron-hole pairs may be tuned by adjusting the ratio of mercury to cadmium in the semiconductor material. Infrared detectors typically sense electromagnetic radiation having a wavelength, generally, between 0.5 and 15 µm (or having an energy of 2 to 0.1 eV). Such infrared detectors may be used for a variety of purposes including target acquisition and tracking.

In certain applications, it is desirable to be able to detect two distinct wavelengths of infrared radiation. The ratio of two different wavelengths of infrared radiation may be used by a targeting computer for target recognition and target distance calculations. Previously, two-color infrared detectors have often been manufactured using one of two types of devices. The first type of device is often described as a triple-layer-heterojunction diode. This device employs two back-to-back diodes forming a three-terminal semiconductor structure. The second type of device includes an N×M array consisting of approximately twice the usual number of individual infrared detector elements. Half of the elements are tuned to a first frequency while the second half are tuned to a second frequency. Both of these types of devices have limitations and disadvantages.

The triple-layer-heterojunction diode includes two infrared sensitive N-type layers separated by a center P-type layer which is insensitive to infrared radiation. The three layers are typically aligned along a vertical axis which is generally parallel to the direction of propagation of the incident infrared radiation. A voltage may be applied between the first and second and second and third layers such that each diode is reverse biased, either sequentially or simultaneously. If each N-type layer is tuned to a separate infrared wavelength, the detector can detect two infrared wavelengths. Unfortunately this type of device requires the center P-type layer and its related interconnect structure. Also, this type of device requires two separate sensing circuits to sense two distinct wavelengths. In the alternate, the device may use one sensing circuit and a multiplexer to alternately connect each N-type layer to the sensing circuit.

The second type of device used to provide a two-color infrared detector simply uses twice as many elements to sense twice as many events. These elements are laid out in the same horizontal plane which is perpendicular to the axis of incident infrared radiation. This format requires geometrically more space which often becomes a critical limitation. In addition, this second type of device is not a true two-color infrared detector since each set of array elements are not aligned along the same optical axis.

SUMMARY OF THE INVENTION

In accordance with the present invention, two-color infrared detectors are provided which substantially eliminate or reduce disadvantages and problems associated with prior infrared detectors. The present invention allows fabrication of a two-color infrared detector from semiconductor materials using selected liquid-phase-epitaxy (LPE) and ion implanting techniques to optimize the performance of the resulting detector based upon its intended application.

In accordance with one aspect of the present invention, a two-color infrared detector may be fabricated with a heterojunction diode and a metal insulator semiconductor (MIS) device. The diode comprises a plurality of semiconductor regions formed from materials which generate electron-hole pairs when struck by infrared radiation having first and second wavelengths respectively. The gate of the MIS device is operable in conjunction with an insulator layer to generate a potential well in the adjacent semiconductor region.

An important technical advantage of the two-color infrared detector includes its ability to simultaneously detect infrared radiation of two different wavelengths without requiring the use of multiple sensing circuits, multiple focal plane arrays or complex clocking circuits. An operator of the infrared detector may determine various quantities related to the spectral distribution of a target based information from the two wavelengths.

Another significant technical advantage of the present invention includes the use of presently available LPE and photolithography techniques to fabricate the desired semiconductor materials, thus reducing system costs and complexity.

A further technical advantage of the present invention includes the use of single voltage source to bias each MIS gate. This feature also reduces system costs, complexity, and size.

Still another technical advantage of the present invention is the vertical integration and alignment of the various components within each element of the infrared detector along the axis of incident infrared radiation. This alignment improves the accuracy of any calculation which assumes a single source for the two wavelengths of infrared radiation.

In accordance with another aspect of the present invention, layers of P and N type semiconductor material may be arranged during fabrication of infrared detector elements to minimize substrate resistance and enhance voltage uniformity across the focal plane array associated with the resulting infrared detector of thermal imaging system. For selected applications, multiple diodes and/or gates may be provided in each infrared detector element to enhance the respective sensor signal and overall performance of the resulting infrared detector.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 depicts a cross-sectional view with portions broken away of one element in a two-color infrared detector element incorporating another embodiment of the present invention;

FIGS. 7a through 7e depict sequential cross-sectional views with portions broken away during manufacture of the two-color infrared detector element depicted in FIG. 6.

DETAILED DESCRIPTION OF THE PREFERRED EMBODIMENTS

The preferred embodiments of the present invention and its advantages are best understood by referring to FIGS. 1 through 8 of the drawings, like numerals being used for like and corresponding parts of the various drawings.

Infrared detectors or thermal imaging systems are typically based upon either the generation of a change in voltage due to a change in temperature resulting from incident infrared radiation striking a thermal sensor or the generation of a change in voltage due to a photoelectron interaction within the material used to form the thermal sensor. This latter effect is sometimes called the internal photoelectric effect. Thermal sensors or infrared detector elements 10, 110 and 210, which will be described later in more detail, function based on the generation of electron-hole pairs resulting from the internal photoelectric effect.

Infrared detectors may be manufactured from semiconductor materials which are structured as photodiodes and/or photocapacitors. U.S. Pat. No. 5,144,138, entitled Infrared Detector and Method, provides information concerning infrared detectors fabricated from HgCdTe semiconductor materials and alloys, which produce electron-hole pairs in response to incident infrared radiation. U.S. Pat. No. 5,144,138 is incorporated by reference for all purposes in this application.

Figure 1:
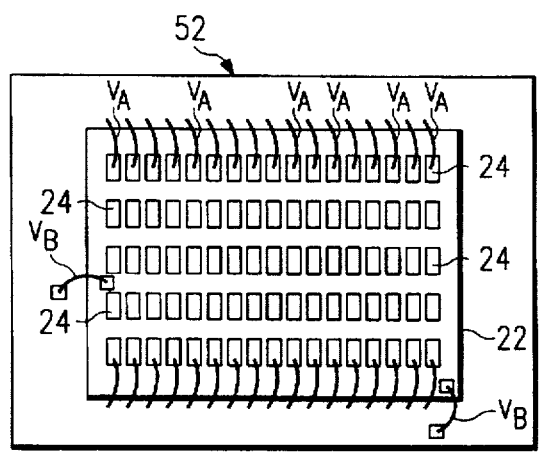
FIG. 1 is a schematic plan view with portions broken away of a two-color infrared detector incorporating the present invention.
Figure 2:
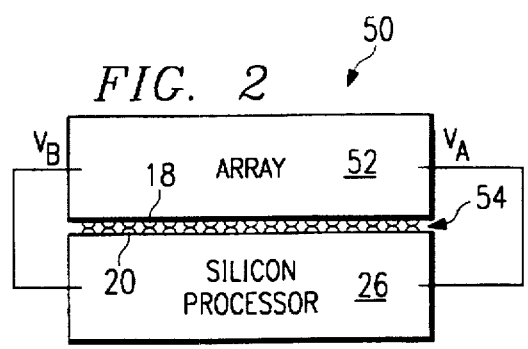
FIG. 2 is a schematic drawing in elevation with portion broken away of the two-color infrared detector of FIG. 1.

FIGS. 1 and 2 are schematic representations of infrared detector or thermal imaging system 50 having focal plane array 52 which responds to incident infrared radiation and silicon processor 26 to process thermal images based upon incident infrared radiation striking focal plane array 52. As shown in FIG. 1, focal plane array 52 comprises a plurality of individual thermal sensors or infrared detector elements. The present invention allows the use of infrared detector elements 10, 110 or 210 as desired to form focal plane array 52. Infrared detector 50 will preferably include a plurality (N×M) of infrared detector elements 10, 110, or 210 bonded to a common silicon processor 26. Each element 10, 110, or 210 will correspond to a pixel in the resulting infrared display produced by infrared detector 50.

As shown in FIG. 1, focal plane array 52 includes a plurality of metal gates 24 associated with infrared detector elements 10. As will be explained later in more detail, infrared detector elements 110 or 210 may be used in place of infrared detector elements 10 to form focal plane array 52. For many applications a layer of insulation (now shown) and a window (not shown) will be disposed over the top of metal gates 24. These items have been removed from FIG. 1 for purposes of illustration.

As shown in FIG. 2, an array of metal bump bonds 54 may be used to connect focal plane array 52 with silicon processor 26. As will be explained later in more detail, metal bump bond array 54 comprises indium bumps 18 associated with their respective infrared detector element 10, 110 or 210 and corresponding indium bumps 20 provided on the adjacent surface of silicon processor 26. Various bonding techniques in addition to indium bumps 18 and 30 may be satisfactorily used to connect focal plane array 52 with silicon processor 26. Such techniques include other types of metal bonding and/or epoxy bonding to provide the desired electrical signal flowpath from each infrared detector element 10, 110 or 210 in focal plane array 52 with silicon processor 26.

Various types of silicon processors or integrated circuit processors may be satisfactorily used in the manufacture of thermal imaging system 50. U.S. Pat. No. 4,684,812 entitled Switching Circuit for a Detector Array, provides information concerning one type of silicon processor satisfactory for use with focal plane array 52. U.S. Pat. No. 4,684,812 is incorporated by reference for all purposes in this application.

Figure 3:
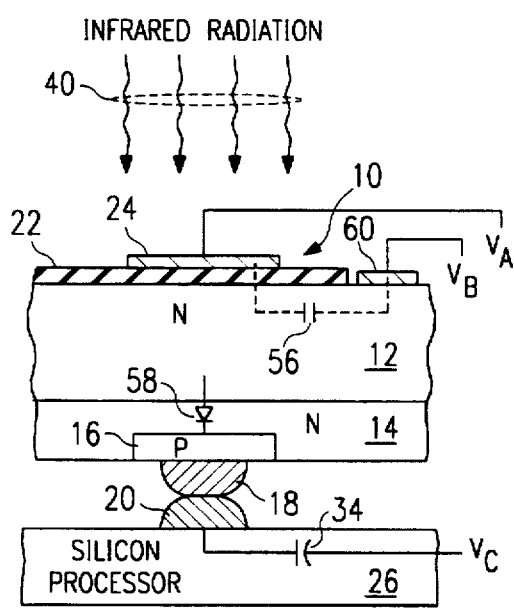
FIG. 3 depicts a cross-sectional view with portions broken away of a two-color infrared detector element incorporating one embodiment of the present invention.

FIG. 3 depicts a cross-sectional view of a single infrared detector element 10 which may be formed as part of focal plane array 52 for two-color infrared detector 50. Focal plane array 52 as shown in FIG. 1 has a 5×17 element array. Elements 10 may be used to form various N×M array configurations.

Element 10 may be generally described as a heterostructure type device comprising a metal insulator semiconductor ("MIS") device or first capacitor 56 on top of a heterojunction diode 58 which is bonded to silicon processor 26. The heterojunction diode 58 includes a plurality of semiconductor regions with each region having selected bandgap energies. Element 10 may also be described as a minority carrier detector.

A first semiconductor region or layer 12 comprises N-type HgCdTe semiconductor material which is sensitive to infrared radiation having a wavelength of approximately five micrometers (5 µm) (sometimes referred to as mid-wavelength). A second semiconductor region or layer 14 comprises N-type HgCdTe semiconductor material which is sensitive to infrared radiation having a wavelength of approximately ten micrometers (10 µm) (sometimes referred to as long wavelength). These wavelengths (5 µm and 10 µm) are in the atmospheric windows (3–5 µm and 8–12 µm) of greatest interest for most infrared detectors. A third semiconductor region or layer 16 comprises P-type HgCdTe semiconductor material which is sensitive to the same infrared radiation (wavelength of approximately 10 μm) as layer 14. Layer 12 may sometimes be referred to as a wide-bandgap layer. Layers 14 and 16 may sometimes be referred to as narrow-bandgap layers. Alternatively, the conductivities may be reversed with layers 12 and 14 being P-type and layer 16 being N-type.

N-type semiconductor materials such as layers 12 and 14 have more electrons than necessary to complete a perfect molecular lattice structure. P-type semiconductor materials such as layer 16 have fewer electrons than necessary to complete a perfect molecular lattice structure. The "missing electrons" are sometimes referred to as "holes." The extra electrons in the N-type semiconductor material and the extra holes in the P-type semiconductor material (hereinafter referred to as "carriers") are the agents which transport or move electrical energy in response to differences in electrical voltage applied to the semiconductor materials.

Layer 16 is preferably bump bonded to a silicon processor 26 through indium bumps 18 and 20. Other types of bonding procedures may be used as an alternative to indium bump bonding if desired. As will be explained later, silicon processor 26 preferably includes circuits for sensing the respective charges associated with the interaction between infrared radiation having the first wavelength (5 μm) and layer 12 and infrared radiation having the second wavelength (10 μm) and layers 14 and 16.

The MIS structure 56 comprises metal gate 24, insulator layer 22 and N-type layer 12. MIS device 56 uses the wide-bandgap associated with layer 12 to form a wide-bandgap infrared detector sensitive to 5 μm infrared radiation. Typically, layers 12, 14 and 22 will extend continuously throughout focal plane array 52 associated with infrared detector 50. Individual infrared detector elements 10 within focal plane array 52 are defined in part by a plurality of metal gates 24 disposed at selected sites on insulator layer 22. The number and location of metal gates 24 define in part the associated N×M focal plane array.

Infrared detector 50 will preferably include a plurality of layers 16 formed in layer 14 to correspond with the number and location of each gate 24 placed on insulator layer 22. Base voltage or biasing voltage ($V_B$) may be applied to layers 12 and 14 to reverse bias the diode junction 58 between each layer 16 and layer 14. Typically, the base voltage is applied to layers 12 and 14 through contacts 60 along the perimeter of focal plane array 52. In addition, electrical contacts $V_A$ and $V_C$ are provided to metal gate 24 and bump 20, respectively.

The use of N-type material to form layers 12 and 14 as compared to P-type material substantially reduces the resistance associated with current flow through layers 12 and 14. Thus, the biasing voltage ($V_B$) applied across layers 12 and 14 remains relatively uniform at each infrared detector element 10. Reducing the resistance within layers 12 and 14 becomes an important factor as the distance increases between each infrared detector element 10 and contacts 60 which supply $V_B$ to layers 12 and 14. For infrared detectors 50 having a large focal plane arrays 52, forming layers 12 and 14 from N-type material will result in a more uniform infrared image.

As depicted in FIG. 3, layers 12, 14 and 16 are preferably aligned along an axis which is generally parallel to the axis of incident radiation. In FIG. 3, arrows 40 show the direction of incident infrared radiation with respect to metal gate 24. Layers 12, 14 and 16 may be arranged in other geometric configurations. In operation, the diode junction 58 is reverse biased with respect to N-type layers 12 and 14 and P-type layer 16. MIS device 56 is preferably pulsed to deep depletion with respect to layer 12. For instance, normal operating values may be $V_A=-5$ V, $V_B=0$ V, and $V_C=-0.5$ V. With the conductivities reversed (layers 12 and 14 P-type and layer 16 N-type), the voltages would also be reversed: $V_A=+5$ V, $V_B=0$ V, and $V_C=+0.5$ V.

The MIS device 56 is preferably fabricated such that it is optically transparent to the infrared wavelengths of interest. Infrared radiation may enter from the top through layers 22 and 12 and pass through the MIS device. The wide-bandgap component of the incident infrared radiation (5 μm) is primarily absorbed in the first few microns (1/absorption length) of layer 12. Electron-hole pairs are generated and the holes diffuse to the respective MIS device 56 where they fill the potential well caused by the voltage $V_A$ on gate 24. With the conductivities reversed, the electrons will fill the potential well caused by a positive voltage $V_A$ on gate 24.

The narrow-bandgap radiation component of the incident infrared radiation (10 μm) travels through wide-bandgap layer 12 to narrow-bandgap layers 14 and 16 where it is absorbed. Electron-hole pairs are generated and the holes then diffuse to the heterojunction and out through P-type layer 16 and indium bumps 18 and 20 to $V_C$. This current flow or sensor signal may be represented as a change in charge on capacitor 34 in silicon processor 26 that is connected to P-type layer 16 of the heterojunction diode 58. Thus, gate 24 of MIS device 56 functions as a first capacitor to integrate charges created by the wide-bandgap part of the infrared radiation in layer 12 and the associated capacitor 34 in silicon processor 26 simultaneously functions as a second capacitor to integrate charges created by the narrow-bandgap part of the infrared radiation in layers 14 and 16. With the conductivities reversed, electrons diffuse to the heterojunction and out through N-type layer 16 and indium bumps 18 and 20 to $V_C$.

After a selected integration time period (100–200 μsec), the charge generated by the second wavelength (10 μm) and collected on capacitor 34 is sensed by silicon processor 26. This charge from layers 14 and 16 is sensed first and capacitor 34 in silicon processor 26 (second capacitor) is immediately reset by setting $V_C=0$ V to allow integrating charges from MIS device 56 collected at the respective gate 24 (first capacitor). The diode 58 is again reverse biased with respect to layer 16, $V_B=0$ and $V_C=-0.5$ V, and the MIS device is reset, $V_A=0$ V. This allows the integrated wide-bandgap charge previously generated in layer 12 to migrate from gate 24 (first capacitor) through the diode junction between layer 14 and the respective layer 16 and on to capacitor 34 in silicon processor 26 (second capacitor). The charge corresponding to wide-bandgap (5 μm) infrared radiation may then be sensed by silicon processor 26 in the same manner as with the previous narrow-bandgap (10 μm) charge. Although integration of the charges generated by the two parts of the infrared spectrum occurs at the same time on the first and second capacitors respectively, the respective charges are sensed sequentially by silicon processor 26.

In infrared detector 50, gate 24 of each MIS devices may be bused together to a common voltage source ($V_A$). There is no need to independently address each MIS device through a row-column addressing scheme because the charge on each gate 24 is read by silicon processor 26 through the respective diode junction 58 defined by the associated P-type layer 16 and not through each gate 24. Each of the diodes defined by the respective P-type layer 16, other than the detector element 10 of interest, may be used as guard diodes to bleed away any unwanted charge. Similarly with the conductivities reversed, N-type layer 16 defines a diode which may be used as a guard diode to bleed away unwanted charge.

The thickness of the two HgCdTe layers 12 and 14 is determined by their respective minority carrier diffusion and bandgap absorption lengths. For wide-bandgap (5 μm) layer 12, the absorption length is a few microns (<5 μm) and the minority carrier diffusion length is 1 to 10 mils. Wide-bandgap layer 12 must be thin enough to insure that the injected charge from each MIS device will diffuse to the respective heterojunction diode defined by the associated P-type layer 16, yet thick enough so that most of the photo-generated charge will diffuse to MIS device 56 during integration and not to the diode 58. This means that the thickness of wide-bandgap layer 12 should be 10 μm or greater and less than 10 mils.

For narrow-bandgap (10 μm) layer 14, the thickness should be less than a minority carrier diffusion length (1–10 mils), but greater than one absorption length (for 10 μm bandgap HgCdTe, the absorption length is 5–10 μm). Thus, narrow-bandgap layer 14 should be 10 μm or greater, and less than 10 mils in thickness. Each layer 16 will preferably have a thickness less than the minority carrier diffusion length (1–10 mils) an also less than the thickness of layer 14. Since the dimensional requirements for layers 12, 14 and 16 allow for considerable flexibility, commercially available and relatively low cost LPE techniques may be used to grow layers 12 and 14. Similarly, commercially available and relatively low cost ion implanting techniques may be used to form P-type or N-type layers 16. For some applications N-type layers may be formed by indium doping and P-type layers formed using arsenic ion implant techniques.

FIGS. 4a through 4e depict sequential cross-sectional views during manufacture of infrared detector element 10 depicted in FIG. 3.

Figure 4A:
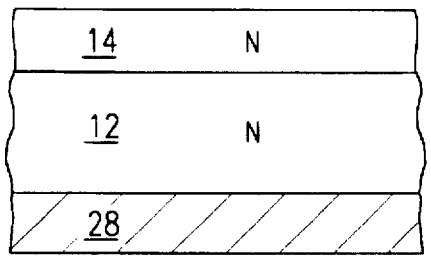
FIGS. 4a through 4e depict sequential cross-sectional views with portions broken away during manufacture of the two-color infrared detector element depicted in FIG. 3.

In FIG. 4a, wide-bandgap layer 12 may be grown on either a CdTe or CdZnTe substrate 28 using LPE growth techniques. As described in connection with FIG. 3, layer 12 is preferably between 10 μm and 10 mils in thickness. In the illustrated embodiment, layer 12 is designed to generate electron-hole pairs when struck by infrared radiation having a wavelength of approximately 5 μm. In the chemical formula $Hg_{1-x}Cd_xTe$, x therefore ranges from 0.25 to 0.40 for this selected sensitivity range. In addition, layer 12 is doped with a suitable N-type dopant such as indium so that layer 12 has a carrier concentration no higher than a few $10^{16} cm^{-3}$ (or doped P-type with a dopant such as Arsenic to a carrier concentration no higher than a few $10^{15} cm^{-3}$). A passivation layer such as of ZnS or CdTe (not shown) may be placed on layer 12 if desired.

Narrow-bandgap HgCdTe layer 14 is next grown on top of layer 12 using the same LPE methods. As described in connection with FIG. 1, layer 14 is preferably between 10 μm and 10 mils in thickness. In the illustrated embodiment, layer 14 is designed to generate election-hole pairs when struck by infrared radiation having a wavelength of approximately 10 μm. In the chemical formula $Hg_{1-x}Cd_xTe$, x therefore ranges from 0.18 to 0.25 for this selected sensitivity range. In addition, layer 14 is doped with a suitable N-type dopant such as indium so that layer 14 has a carrier concentration no higher than a few $10^{16} cm^{-3}$ corresponding with layer 12 (or doped P-type with Arsenic to a carrier concentration no higher than a few $10^{15} cm^{-3}$).

For one embodiment of the present invention, layer 12 may be grown using liquid phase epitaxy (LPE) techniques with an initial thickness of approximately 50 μm and layer 14 was grown using LPE techniques to a thickness of approximately 10 μm. The doping of both layers 12 and 14 may be N-type ($4 \times 10^{15}$ $cm^{-3}$) using extrinsic doping techniques or P-type ($4 \times 10^{15}$ $cm^{-3}$) using vacancy doping techniques.

Figure 4B:
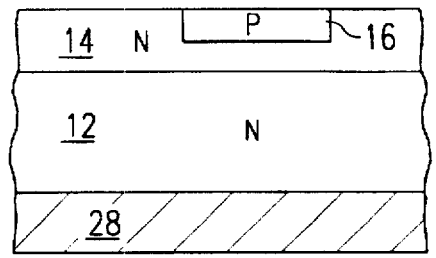

As shown in FIG. 4b, ion implanting techniques may next be used to form a plurality of P-type (or N-type) layers 16 at various locations in layer 14. Such ion implanting techniques may use materials such as arsenic ions (for P-type) or boron ions (for N-type) so that layer 16 has a carrier concentration up to a few $10^{15} cm^{-3}$ (or a few $10^{16} cm^{-3}$ for N-type)

The location of each layer 16 is selected to correspond with the desired location of the associated MIS gate 24. Since layer 14 is formed in narrow bandgap (10 μm) HgCdTe material, layer 16 will have the same sensitivity to infrared radiation as layer 14. The exposed surface of layers 14 and 16 may be passivated to ensure the operational reliability of infrared detector 50. Such passivation layer (not shown) may be formed by annealing the exposed surface in a furnace after ion implanting and depositing a thin, 1 mil, layer of ZnS or CdTe thereon. Ion implantation will preferably result in forming an amorphous layer 16 of P-type (or N-type) material. For one embodiment, typical dimensions of each layer 16 may be 18×23 mils. The location of each gate 24 and its associated layer 16, the level of doping in layers 12, 14 and 16, and the thickness of layers 12, 14 and 16 are selected to minimize cross talk between adjacent infrared detector elements 10.

Figure 4C:
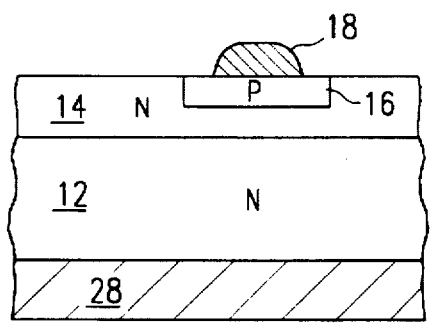
Figure 4D:
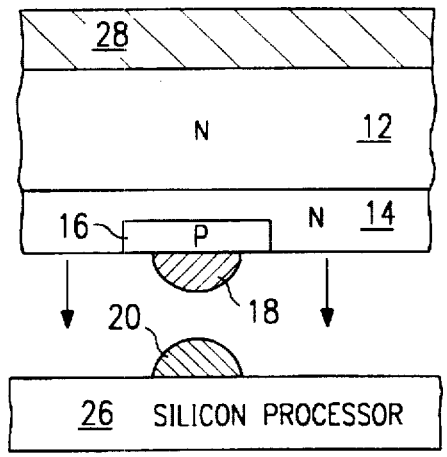

As shown in FIG. 4c, indium bump 18 may be formed on top of each layer 16 using standard photolithographic techniques. Bump 18 is generally from 1 to 3 μm thick. The resulting structure is then mated to silicon processor 26 as depicted in FIG. 4d. Silicon processor 26 comprises a plurality of indium bumps 20 which correspond to indium bumps 18 already formed on each layer 16. Because indium is a soft malleable metal, these two structures will be permanently connected to form metal bump bond array 54 when bumps 18 and 20 are pressed together. Alternately, epoxy may be injected between silicon processor 26 and layers 14 and 16 to ensure a more secure sensor signal connection.

Figure 4E:
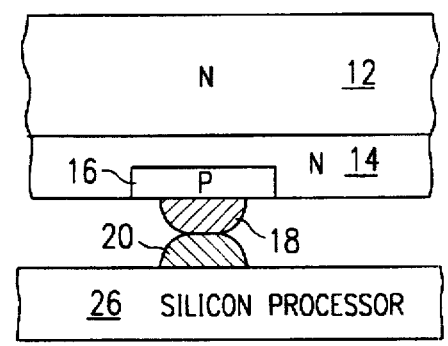

In FIG. 4e, substrate 28 has been removed from layer 12 using processes such as bromine methanol etch and/or diamond point turning. For one embodiment, the thickness of layer 12 may be reduced from 50 μm to 10 μm during the removal of substrate 28. Approximately 1600 Å of ZnS may then be deposited on the exposed surface of layer 12 to form insulator layer 22 of the MIS structure 56. Finally, fifty to eighty Å of an infrared transparent metal such as nickel may be deposited, patterned, and etch according to standard photolithographic techniques to form a plurality of gates 24 corresponding to the desired N×M focal plane array structure. Gates 24 may also be formed from other materials such as alloys of titanium. The resulting finished element 10 of two-color infrared detector 50 is shown in FIG. 3.

Figure 5A:
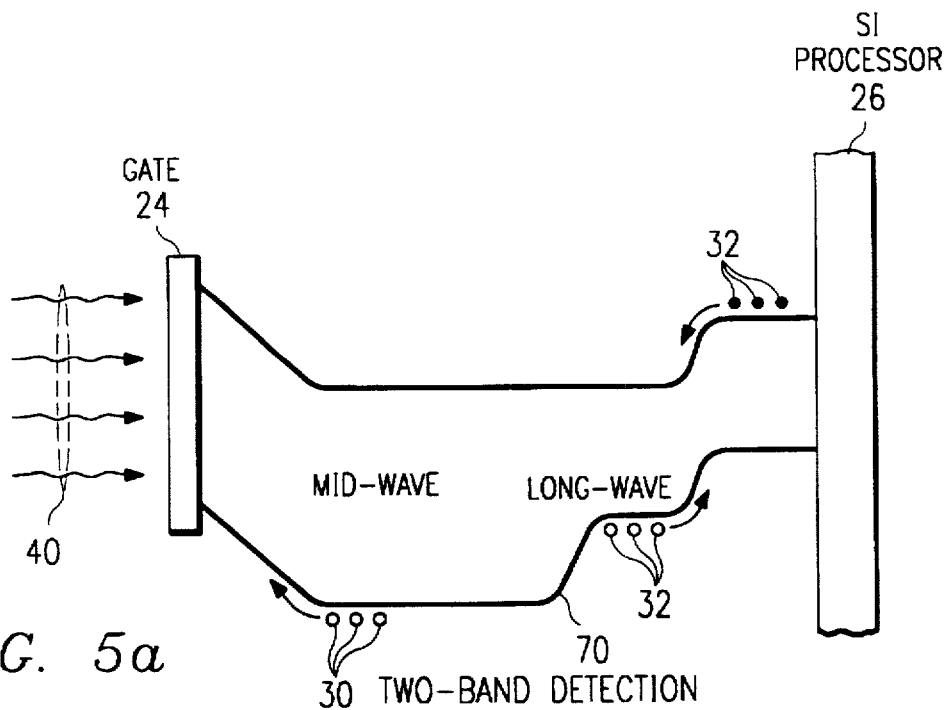
FIG. 5a is a schematic representation of the band diagram for the two-color infrared detector element of FIG. 3 during simultaneous detection of mid-wave (5 µm) and long-wave (10 µm) infrared radiation.
Figure 5B:
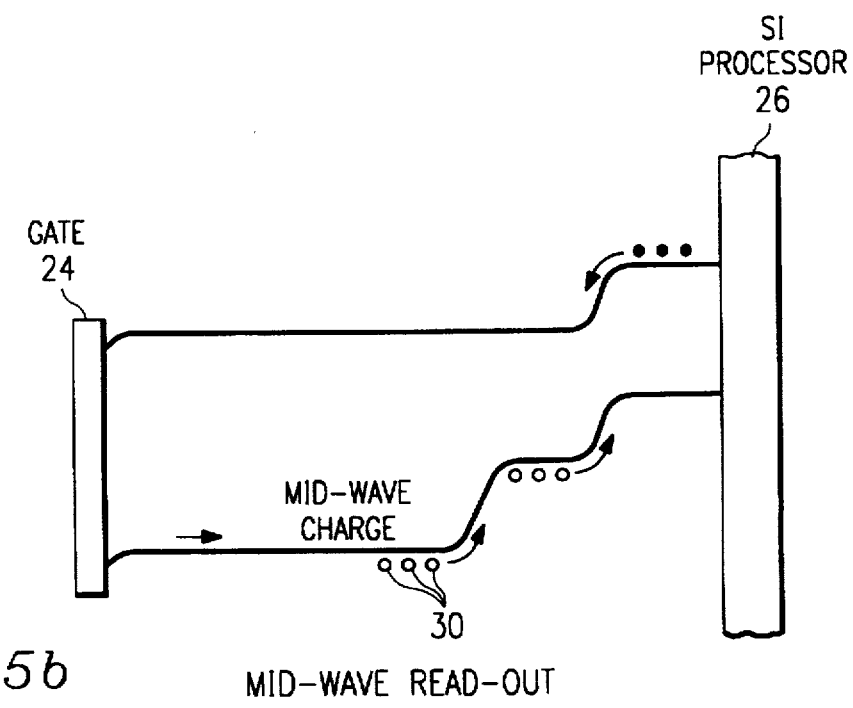
FIG. 5b is a schematic representation of the band diagram for the two-color infrared detector element of FIG. 3 during readout of the mid-wave charge.
Figure 5C:
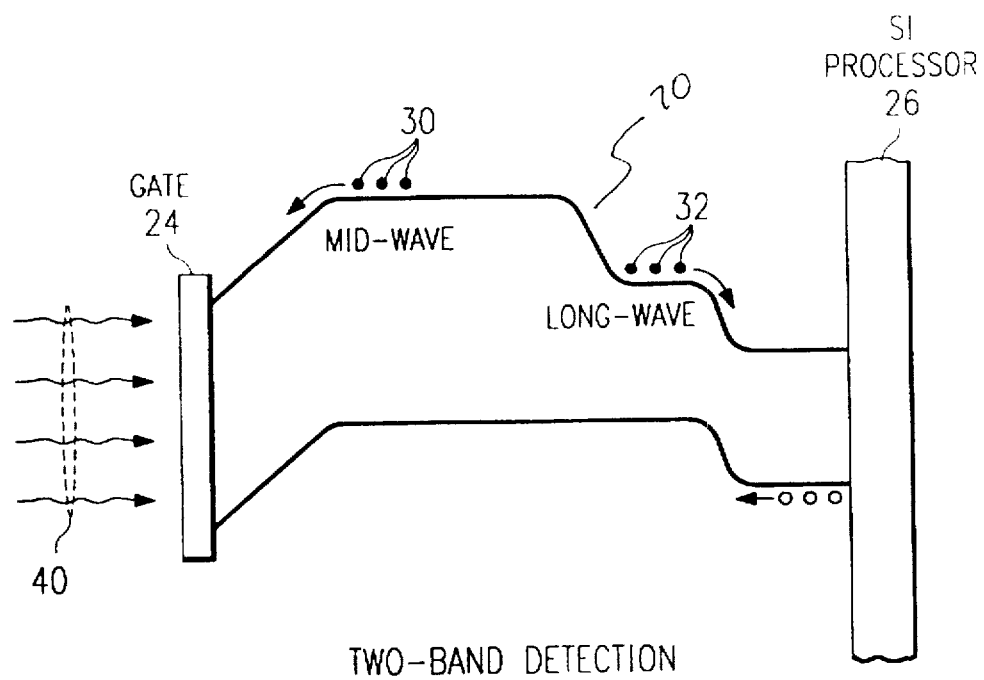
FIG. 5c is a schematic representation of the band diagram for the two-color infrared detector element having opposite conductivity types of FIG. 3 during simultaneous detection of mid-wave and long-wave infrared radiation.
Figure 5D:
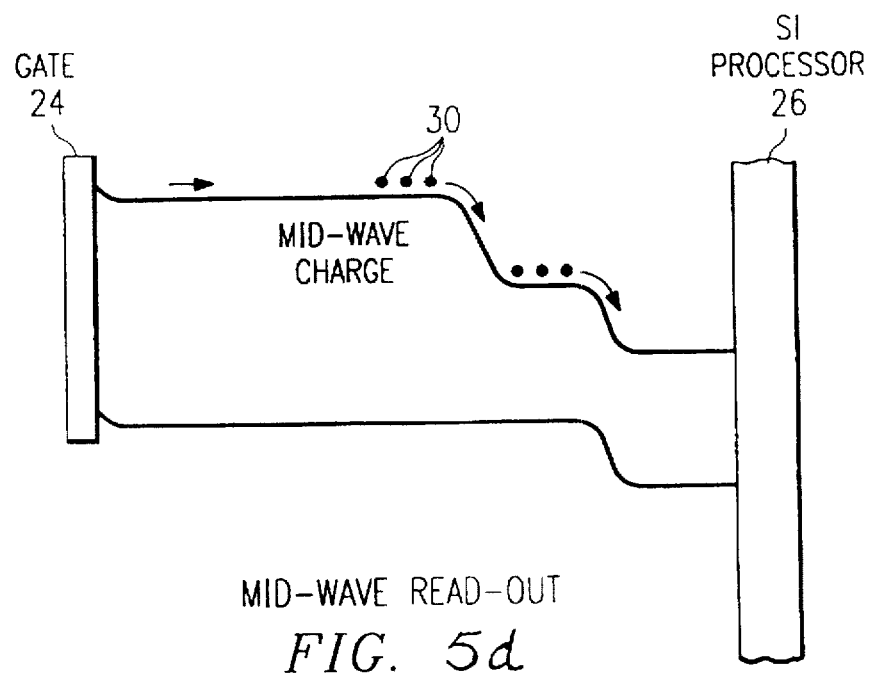
FIG. 5d is a schematic representation of the band diagram for the two-color infrared detector element having the opposite conductivity types of FIG. 3 during readout of the mid-wave charge.

A schematic representation of the band diagrams associated with two color infrared detector element 10 are shown in FIGS. 5a and 5b for the embodiment with N-type layers 12 and 14 and FIGS. 5c and 5d for the embodiment with P-type layers 12 and 14. As illustrated in FIG. 5a, when gate 24 is pulsed, the associated MIS structure 56 or mid-wave capacitor is placed in deep depletion which creates a potential well for storing holes which have been generated by mid-wavelength (5 μm) infrared radiation in layer 12. The potential well results in charges 30 flowing towards gate 24. Since the diode junction 58 between layers 14 and 16 is reversed biased, charges 32 associated with electron-hole pairs generated in second semiconductor region 14 and third semiconductor region 16 by long wavelength (10 μm) infrared radiation will flow through the associated diode 58 and indium bumps 18 and 20 to capacitor 34 provided in silicon processor 26. FIG. 5a demonstrates that no potential barrier exists to prevent minority carriers from reaching either gate 24 of MIS capacitor 56 for storing mid-wavelength charges or capacitor 34 provided in silicon processor 26 for storing long-wavelength charges. Similarly, FIG. 5C illustrates electrons being stored in the potential well.

When gate 24 is reset, charges 30 stored on gate 24 will flow through the associated diode 58 to capacitor 34 in silicon processor 26. The band diagram of FIG. 5b demonstrates that there is no barrier preventing the transfer from gate 24 to silicon processor 26 of charges 30 generated by the mid-wavelength infrared radiation. Similarly, FIG. 5d shows there is no barrier for transfer of charges 30 generated by the mid-wavelength infrared radiation from gate 24 to silicon processor 26.

As shown in FIG. 5a, due to the nature of band bending in the conduction band for layers 14 and 16 holes produced by long wavelength infrared radiation in N-type layer 14 and P-type layer 16 are blocked from reaching metal gate 24 due to potential barrier 70 which blocks the movement of such holes towards gate 24. By forming layers 12, 14 and 16 from the desired N and P-type materials, long-wave crosstalk into the mid-wave capacitor 56 may be effectively minimized. Analogously, FIG. 5c shows for electrons produced by long wavelength infrared radiation in P-type layer 14 and N-type layer 16 potential barrier 70 blocks the movement of such electrons towards gate 24.

As shown in FIGS. 5b and 5d, during readout of the mid-wave charge collected on gate 24 the associated diode 58 is reversed bias resulting in both the mid-wave charge collected on gate 24 and in the long-wave charge generated in layers 14 and 16 transferring to capacitor 34. Thus, it is desirable that the time required for transfer from gate 24 to capacitor 34 be minimized to avoid intermixing charges generated by long-wave radiation with charges generated by mid-wave infrared radiation. As indicated by FIGS. 5b and 5d, there is no barrier in infrared detector element 10 between the mid-wave region and the long-wave region which will reduce the charge transfer efficiency or increase the time required to complete the transfer.

FIG. 6 depicts a cross-sectional view of infrared detector element 110 which may be used to form focal plane array 52 of two-color infrared detector 50 incorporating an alternative embodiment of the present invention. Element 110 may be generally described as a heterostructure type device comprising a metal insulator semiconductor ("MIS") device or first capacitor 156 on top of two heterojunction diodes 158 and 168. Heterojunction diodes 158 and 168 may sometimes be referred to as back to back diodes.

Each heterojunction diode 158 and 168 includes a plurality of semiconductor regions with each region having selected bandgap energies. Element 110 may also be described as a minority carrier detector. Each element 110 will correspond to a pixel in the resulting infrared display produced by infrared detector 50.

A first semiconductor region or layer 112 comprises P-type HgCdTe semiconductor material which is sensitive to infrared radiation having a wavelength of approximately five micrometers (5 μm) (sometimes referred to as mid-wavelength). As previously discussed with respect to infrared detector element 10, the use of N-type semiconductor material will reduce substrate resistance between biasing voltage ($V_B$) applied to the periphery of focal plenary 52 and metal gate 24 associated with each infrared detector element 10. By using P-type semiconductor material to form layer 12, the quantum efficiency of layer 12 with respect to mid-wave (5 μm) infrared radiation is enhanced as compared to N-type material. Also, P-type materials often have better characteristics with respect to dumping charges collected on gate 24 through heterojunction diode 158 to silicon processor 26. An important feature of the present invention is the ability to select the semiconductor materials which will optimize the performance of the resulting infrared detector 50 for selected applications.

A second semiconductor region or layer 114 comprises N-type HgCdTe semiconductor material which is sensitive to infrared radiation having a wavelength of approximately ten micrometers (10 μm) (sometimes referred to as long wavelength). A third semiconductor region or layer 116 comprises N-type HgCdTe semiconductor material which is sensitive to the same infrared radiation (wavelength of approximately 5 μm) as layer 112. Layers 112 and 116 may also be referred to as a wide-bandgap layer. Layer 114 may sometimes be referred to as narrow-bandgap layer.

P-type semiconductor material such as layer 112 has fewer electrons than necessary to complete a perfect molecular lattice structure. The "missing electrons" are sometimes referred to as "holes." N-type semiconductor materials such as layers 114 and 116 have more electrons than necessary to complete a perfect molecular lattice structure. The extra electrons in the N-type semiconductor material and the extra holes in the P-type semiconductor material (hereinafter referred to as "carriers") are the agents which transport or move electrical energy in response to differences in electrical voltage applied to the semiconductor materials.

Layer 114 is preferably bump bonded to a silicon processor 26 through indium bumps 18 and 20. Other types of bonding procedures may be used as an alternative to indium bump bonding if desired. Silicon processor 26 will produce an infrared image in response to the interaction between infrared radiation having the first wavelength (5 μm) and layers 112 and 116 and infrared radiation having the second wavelength (10 μm) and layer 114.

The MIS device 156 comprises a pair of metal gates 24 and 124, insulator layer 22, and layers 112 and 116 of selected semiconductor materials. For some applications additional insulator layers (not shown) may be used to position and protect gates 24 and 124. Metal gate 124 is preferably placed directly on layer 116 to condition the signal collected on metal gate 24 from layer 116. Voltage ($V_A$) is only supplied to gate 24.

MIS device 156 uses the wide-bandgap associated with layers 112 and 116 to form a wide-bandgap infrared detector sensitive to 5 μm infrared radiation. Typically, layers 112 and 114 of selected semiconductor materials and insulator layer 22 will extend throughout focal plane array 52. Individual detector elements 110 within focal plane array 52 are defined in part by a plurality of metal gates 24 and 124 disposed at selected sites on insulator layer 22.

A plurality of layers 116 may be formed in layer 114 to correspond with the number and location of each pair of gates 24 and 124. Base voltage ($V_B$) may be applied to layer 112 to reverse bias both first diode junction 158 between layer 112 and layer 114 and second diode junction 158 between layer 112 and layer 116. Preferably, base voltage ($V_B$) is applied to layer 112 through contacts along the perimeter of focal plane array 52. In addition, electrical contacts $V_A$ and $V_C$ are provided to metal gate 24 and bump 20, respectively.

As depicted in FIG. 6, layers 112, 114 and 116 are preferably aligned along an axis which is generally parallel to the axis of incident radiation. In FIG. 6, arrows 40 show the direction of incident infrared radiation with respect to metal gates 24 and 124. Layers 112, 114 and 116 may be arranged in other geometric configurations. In operation, the diode junctions 158 and 168 are reverse biased with respect to P-type layer 112 and N-type layers 114 and 116, respectively. MIS device 156 is preferably pulsed to deep accumulation with respect to layer 116. For instance, normal operating values may be $V_A=5$ V, $V_B=0$ V, and $V_C=0.5$ V.

Figure 8:
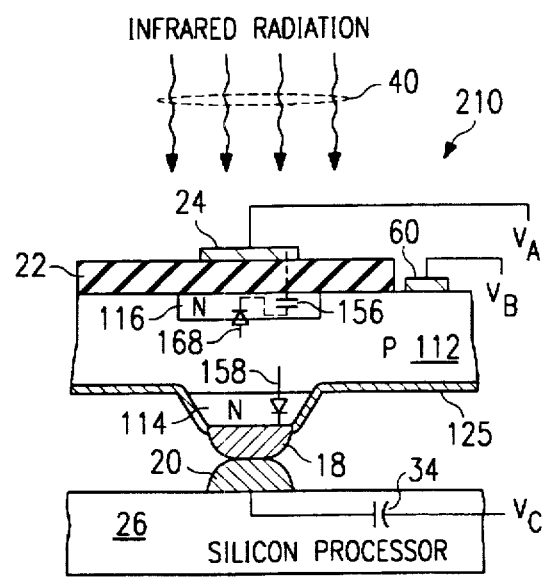
FIG. 8 depicts a cross-sectional view with portions broken away of a two-color infrared detector incorporating a further embodiment of the present invention.

Each MIS device 156 is preferably fabricated such that it is optically transparent to the wavelengths of interest. Infrared radiation may enter from the top through layer 22 and pass through MIS device 156. The use of both metal gates 24 and 124 will reduce the quantum efficiency of the associated infrared detector element 110 as compared to an infrared detector element having only one metal gate 24. For those applications in which signal conditioning is important, metal gate 124 may be included. For other applications in which enhanced signal conditioning is not required, metal gate 124 may be eliminated as shown in FIG. 8 for infrared detector element 210.

The wide-bandgap component of the incident infrared radiation (5 µm) is primarily absorbed in the first few microns (1/absorption length) of layers 112 and 116. Electron-hole pairs are generated and the electrons diffuse to the MIS device where they fill the potential well caused by the voltage $V_A$ on gate 24. The narrow-bandgap radiation component of the incident infrared radiation (10 µm) travels through wide-bandgap layers 112 and 116 to narrow-bandgap layer 114 where it is absorbed. Electron-hole pairs are generated and the electrons then diffuse to the heterojunction and out through N-type layer 114 and indium bumps 18 and 20 to $V_C$. This current flow or signal may be represented as a change in charge on capacitor 34 in silicon processor 26 that is connected to N-type layer 114 of heterojunction diode 158. Thus, gate 24 of the MIS device functions as a first capacitor to integrate charges created by the wide-bandgap part of the infrared radiation in layers 112 and 116 and the associated capacitor 34 in silicon processor 26 simultaneously functions as a second capacitor to integrate charges created by the narrow-bandgap part of the infrared radiation in layer 114.

After a selected integration time period (100-200 µsec), the charge generated by the second wavelength (10 µm) and collected on capacitor 34 is sensed by silicon processor 26. This charge from layer 114 is sensed first and capacitor 34 in silicon processor 26 (second capacitor) is immediately reset by setting $V_C=0$ V to allow integrating charges from MIS device 156 collected at the respective gate 24 (first capacitor). Diode 168 is forward biased and diode 158 is reverse biased with respect to layers 116 and 114, $V_B=0$ and $V_C=0.5$ V, and the MIS device 156 is reset, $V_A=0$ V. This allows the integrated wide-bandgap charge previously generated in layers 116 and 112 to migrate from gate 24 (first capacitor) through the respective diode junction 168 between layers 112 and 116 and diode junction 158 between layer 112 and layer 114 on to capacitor 34 in silicon processor 26 (second capacitor). The charge corresponding to wide-bandgap (5 µm) infrared radiation may then be sensed by silicon processor 26 in the same manner as with the previous narrow-bandgap (10 µm) charge. Although integration of the charges generated by the two parts of the infrared spectrum occurs at the same time on the first and second capacitors respectively, the respective charges are sensed sequentially by silicon processor 26.

The thickness of the two HgCdTe layers 112 and 114 is determined by their respective minority carrier diffusion and bandgap absorption lengths. For wide-bandgap (5 µm) P-type layer 112, the absorption length is a few microns (<5 µm) and the minority carrier diffusion length is 5 to 10 mils. Wide-bandgap layer 112 must be thin enough to insure that the injected charge from each MIS device will diffuse to the respective heterojunction diode 158 defined by the associated N-type layer 114, yet thick enough so that most of the photo-generated charge will diffuse to MIS device 156 through diode 168 during integration and not to diode 158. This means that the thickness of wide-bandgap layer 112 should be 10 µm or greater and less than 10 mils.

For narrow-bandgap (10 µm) N-type layer 114, the thickness should be less than a minority carrier diffusion length (5-10 mils), but greater than one absorption length (for 10 µm bandgap HgCdTe, the absorption length is 5-10 µm). Thus, narrow-bandgap layer 114 should be 10 µm or greater, and less than 10 mils in thickness. Each N-type layer 116 will preferably have a thickness less than the minority carrier diffusion length (1-2 mils) and also less than the thickness of layer 112. Since the dimensional requirements for layers 112, 114 and 116 allow for considerable flexibility, commercially available and relatively low cost LPE techniques may be used to grow layers 112 and 114. Similarly, commercially available and relatively low cost ion implanting techniques may be used to form N-type layers 116.

FIGS. 7a through 7e depict sequential cross-sectional views during manufacture of infrared detector element 110 depicted in FIG. 6.

In FIG. 7a, wide-bandgap P-type layer 112 may be grown on either a CdTe or CdZnTe substrate 28 using LPE growth techniques. As described in connection with FIG. 6, layer 112 is preferably between 10 µm and 10 mils in thickness. In the illustrated embodiment, layer 112 is designed to generate electron-hole pairs when struck by infrared radiation having a wavelength of approximately 5 µm. In the chemical formula $Hg_{1-x}Cd_xTe$, x therefore ranges from 0.25 to 0.40 for this selected sensitivity range. In addition, layer 112 is doped with a suitable P-type dopant such as copper or mercury vacancies so that layer 112 has a carrier concentration no higher than a few $10^{15} cm^{-1}$. A passivation layer such as of ZnS or CdTe (not shown) may be placed on layer 112 if desired.

Narrow-bandgap N-type HgCdTe layer 114 is next grown on top of layer 112 using the same LPE methods. As described in connection with FIG. 6, layer 114 is preferably between 10 µm and 10 mils in thickness. In the illustrated embodiment, layer 114 is designed to generate election-hole pairs when struck by infrared radiation having a wavelength of approximately 10 µm. In the chemical formula $Hg_{1-x}Cd_xTe$, x therefore ranges from 0.18 to 0.25 for this selected sensitivity range. In addition, layer 114 is doped with a suitable N-type dopant such as indium so that layer 114 has a carrier concentration no higher than a few $10^{16} cm^{-3}$.

For one embodiment of the present invention using liquid phase epitaxy (LPE) techniques, layer 112 may be grown with an initial thickness of approximately 50 µm and layer 114 grown to a thickness of approximately 10 µm. The doping of layer 112 may be P-type ($4 \times 10^{15}$ cm$^{-3}$) using vacancy doping techniques.

In FIG. 7b, layers 112 and 114 may be etched using a mixture of bromine and methanol to form a mesa using standard photolithographic techniques. The exposed surfaces of layers 112 and 114 and the side walls of the mesa are passivated to insure the required operational reliability of the associated infrared detector element 110. A passivation layer 125 may be formed by annealing the exposed surfaces in a furnace and depositing with a thin, 1 mil, layer of ZnS or CdTe. In FIG. 7c via 128 has been etched through passivation layer 125 to expose the top of the mesa using a mixture of bromine and methanol. Indium bump 18 is next formed on via 128 using standard photolithographic techniques.

As shown in FIG. 7d, indium bump 18 may be formed on each layer 114 using standard photolithographic techniques. Bump 18 is generally from 1 to 3 μm thick. The resulting structure is then mated to silicon processor 26 as depicted in FIG. 7d. Silicon processor 26 comprises a plurality of indium bumps 20 which correspond to indium bumps 18 already formed on each N-type layer 114. Because indium is a soft malleable metal, these two structures will be permanently connected when bumps 18 and 20 are pressed together. Alternately, epoxy may be injected between silicon processor 26 and layers 114 and 112 to ensure a more secure connection.

In FIG. 7e, substrate 28 has been removed from layer 112 using processes such as bromine methanol etch and/or diamond point turning. For one embodiment, the thickness of layer 112 may be reduced from 50 μm to 10 μm during the removal of substrate 28. Ion implanting techniques may next be used to form a plurality of N-type layers 116 at various locations in layer 112. Such ion implanting techniques may use materials such as indium so that layer 116 has a carrier concentration up to a few $10^{16} cm^{-3}$.

The location of each layer 116 is selected to correspond with the desired location of the associated gates 24 and 124. Since layer 112 is formed in wide bandgap (5 μm) HgCdTe material, layer 116 will have the same sensitivity to infrared radiation as layer 112. The exposed surface of layers 112 and 116 may be passivated as desired. Ion implantation will preferably result in forming an amorphous layer 116 of N-type material. For one embodiment, typical dimensions of each layer 116 were 18×23 mils. An infrared transparent metal such as nickel or titanium metal alloy may be directly deposited on each layer 116 to form gate 124. The location of each gate 24 and its associated layer 116, the level of doping in layers 112, 114 and 116, and the thickness of layers 112, 114 and 116 are selected to minimize cross talk between adjacent elements 110.

Approximately 1600 Å of ZnS may then be deposited on the exposed surface of layers 112 and 116 to form insulator layer 22 of the MIS structure 156. Finally, fifty to eighty Å of an infrared transparent metal such as nickel or titanium alloy may be deposited, patterned, and etch according to standard photolithographic techniques to form a plurality of gates 24 corresponding with gates 124 and the desired N×M focal plane array structure. The resulting finished element 110 of two-color infrared detector 50 is shown in FIG. 6.

FIG. 8 depicts a cross-sectional view of one infrared detector element 210 in focal plane array 50 for two-color infrared detector 50 incorporating an alternative embodiment of the present invention.

Infrared detector elements 110 and 210 are essentially the same except metal gate 124 is not included within infrared detector element 210. Depending upon the nature of the surface state associated with layer 116, metal gate 124 may not be required. In infrared detector element 210, gate 24 is used to store electrons during the integration of charges formed by mid-wavelength infrared radiation and layer 116. By removing metal gate 124 from infrared detector element 210, the electrons will be stored at the interface with insulator layer 22. Therefore, when layer 116 is formed from N-type material having only a very small range of surface states, metal gate 124 may be eliminated which improves the overall quantum efficiency of infrared detector element 210 as compared to infrared detector element 110.

Infrared detector elements 110 and 210 enhance the performance of the resulting infrared detector 50 since diodes 168 and 158 are used to detect incident infrared radiation as opposed to using MIS device 156 for both detection of infrared radiation and collection of the resulting charge. For some applications, diodes 58, 158 and/or 168 may be formed as homojunction diodes. For other applications, diodes 58, 158 and/or 168 may be formed as heterojunction diodes.

As an alternative to forming the mesa type structures of FIGS. 7b and 7c, layers 114 of infrared detector elements 110 and 210 may be formed using selective doping techniques as previously described for layer 16 in infrared detector element 10. In the same respect layer 116 of infrared detector elements 110 and 210 may be formed using mesa type fabrication procedures as compared to selective doping.

As apparent from the teachings of infrared detector elements 10, 110, and 210, the N and P layers of the various structures may be reversed with suitable carrier concentrations to prevent potential barriers between the majority and minority carriers of adjacent layers. Various combinations of layers may be used as long as the charge generated by the mid-wave infrared region will first collect on the metal gate of the associated MIS device and diffuse or migrate through the associated diode 58 or 158 to silicon processor 26 after the selected collection interval.

Although the present invention and its advantages have been described in detail, it should be understood that various changes, substitutions and alterations can be made therein without departing from the spirit and scope of the invention as defined by the appended claims.

What I claimed is:

1. A two-color infrared detector comprising:
   (a) a diode having first, second and third semiconductor regions, said second semiconductor region disposed between said first and third semiconductor regions and said first and third regions spaced from each other;
   (b) said first semiconductor region composed of material of a first conductivity type and operable to generate electron-hole pairs when struck by infrared radiation having a first wavelength; said second semiconductor region composed of material of said first conductivity type and operable to generate electron-hole pairs when struck by infrared radiation having a second wavelength different from said first wavelength; said third semiconductor region composed of material of conductivity type opposite said first type and operable to generate electron-hole pairs when struck by infrared radiation having said second wavelength;
   (c) an electrical insulator layer disposed on said first semiconductor region and remote from said second semiconductor region;
   (d) a metal gate disposed on said electrical insulator layer and remote from said second semiconductor region for creating a potential well in said first semiconductor region;
   (e) an electrically conductive layer disposed on said first semiconductor region, adjacent to said electrical insulator layer, spaced from said metal gate and remote from said second semiconductor region; and (f) an electrical conductor disposed on said third semiconductor region remote from said first and second semiconductor regions.

2. The infrared detector of claim 1 wherein the semiconductor regions comprise alloys of mercury, cadmium and tellurium.

3. The infrared detector of claim 1 wherein said metal gate and said third semiconductor region are aligned along an axis which is generally parallel to the axis of incident infrared radiation.

4. The infrared detector of claim 1 further comprising a silicon processor coupled to said electrical conductor for sequentially determining the charge formed in said first semiconductor region by radiations of said first wavelength and the charge formed in said second and third semiconductor regions by radiations of said second wavelength.

5. The infrared detector of claim 1 further comprising:

the first semiconductor region having a bandgap which is photosensitive to photons with a wavelength of approximately 5 µm; and the second and third semiconductor regions having a bandgap which is photosensitive to photons with a wavelength of approximately 10 µm.

6. A two-color infrared detector comprising:

(a) first, second and third semiconductor regions, said second semiconductor region disposed between said first and third semiconductor regions;

(b) said first semiconductor region having a first conductivity type material operable to generate electron-hole pairs when struck by infrared radiation having a first wavelength; said second semiconductor region having a second conductivity type material operable to generate electron-hole pairs when struck by infrared radiation having a second wavelength different from said first wavelength; said third semiconductor region having said second conductivity type material operable to generate electron-hole pairs when struck by infrared radiation having said first wavelength;

(c) said third semiconductor region disposed within said first semiconductor region;

(d) an electrical insulator layer disposed on said first and third semiconductor regions and remote from said second semiconductor region;

(e) a metal gate disposed on said electrical insulator layer and remote from said second semiconductor region for creating a potential well in said third semiconductor region;

(f) a first diode junction disposed between said first semiconductor region and said second semiconductor region;

(g) a second diode junction disposed between said first semiconductor region and said third semiconductor region;

(h) an electrically conductive layer disposed on said first semiconductor region, adjacent to said electrical insulator layer and remote from said second semiconductor region; and (i) an electrical conductor disposed on said second semiconductor region remote from said first and third semiconductor regions.

7. The infrared detector of claim 6 wherein the semiconductor regions comprise alloys of mercury, cadmium and tellurium.

8. The infrared detector of claim 6 wherein said electrically conductive layer and said gate are connected to voltage sources.

9. The infrared detector of claim 6 further comprising the first diode junction, the second diode junction and the metal gate aligned along an axis which is generally parallel to the axis of incident infrared radiation.

10. The infrared detector of claim 6 further comprising a silicon processor coupled to said electrical conductor for sequentially determining the charge formed in said first and third semiconductor regions by radiations of said first wavelength and the charge formed in said second semiconductor region by radiations of said second wavelength.

11. The infrared detector of claim 6 further comprising:

the first and third semiconductor regions having a bandgap which is photosensitive to photons with a wavelength of approximately 5 µm; and the second semiconductor regions having a bandgap which is photosensitive to photons with a wavelength of approximately 10 µm.

12. A two-color infrared detector having a plurality of infrared detector elements comprising:

(a) a plurality of diodes, each diode having a plurality of semiconductor regions;

(b) a first semiconductor region and a second semiconductor region disposed adjacent to each other and comprising materials formed from alloys of mercury, cadmium and tellurium;

(c) said first semiconductor region operable to generate electron-hole pairs when struck by infrared radiation having a first wavelength and said second semiconductor region operable to generate electron-hole pairs when struck by infrared radiation having a second wavelength different from said first wavelength;

(d) a plurality of third semiconductor regions, one for each of said detector elements, comprising materials formed from alloys of mercury, cadmium and tellurium operable to generate electron-hole pairs when struck by infrared radiation;

(e) each third semiconductor region disposed at a selected location to partially define the corresponding infrared detector element of the infrared detector;

(f) an electrical insulator layer disposed on said first semiconductor region remote from the said second semiconductor region;

(g) a plurality of metal gates, one for each of said detector elements, disposed on said insulator layer remote from said first semiconductor region to collect charges generated in said first semiconductor region by infrared radiation having said first wavelength;

(h) a plurality of electrically conductive layers disposed on said first semiconductor region, one for each of said detector elements, adjacent to said electrical insulator layer and remote from said second semiconductor region; and (i) a bump bond formed on the second semiconductor region and extending therefrom for use in mating each corresponding infrared detector element with a silicon processor and for sequentially transmitting charges generated by the infrared radiation in the semiconductor regions to the signal processor.

13. The infrared detector of claim 12 further each infrared detector element further comprises:

a connector for supplying voltage ($V_A$) from a common voltage source to each metal gate; and the charges associated with electron-hole pairs generated in the first semiconductor region directed to the silicon processor through the associated diode and the associated indium bump by resetting the voltage ($V_A$) supplied to each metal gate.

14. The infrared detector of claim 12 further comprising:

a connector for supplying a first voltage ($V_A$) to each metal gate;

a connector for supplying a second voltage ($V_B$) to the first semiconductor region; and the indium bump transmitting signals to the silicon processor corresponding respectively to charges generated in the second and third semiconductor regions and the charges collected from the first semiconductor region.

15. The infrared detector of claim 12, further comprising:

a signal processor having sensing circuits for determining the charge formed in the semiconductor region by the first wavelength and the second wavelength; and an indium bump bond transmitting signals sequentially corresponding respectively to the charge generated by the first wavelength and the second wavelength.

16. A method for fabricating an infrared detector for simultaneously detecting two wavelengths of infrared radiation comprising the steps of:

(a) forming on a substrate a first layer of first conductivity type material operable to generate electron-hole pairs when struck by infrared radiation having a first wavelength;

(b) forming a second layer of material of said first conductivity type and operable to generate electron-hole pairs when struck by infrared radiation having a second wavelength on the first layer of material opposite from the substrate;

(c) forming a plurality of third layers of material of a second conductivity type at selected locations within the second layer of semiconductor material;

(d) removing the substrate from the first layer of material;

(e) placing an insulator layer on the first layer of material opposite from the second layer of material; and (f) placing a plurality of metal gates on the insulator layer with each metal gate aligned vertically with respect to its associated third layer of material.

17. The method of claim 16 further comprising the steps of:

placing an indium bump on each third layer of material; and mating the indium bump on each third layer of material with a corresponding indium bump formed on a silicon processor.

18. The method of claim 16 further comprising the steps of:

mating each third layer of material with a corresponding bond formed on a silicon processor;

placing the plurality of metal gates on the insulator layer with each metal gate aligned vertically with its associated third layer of material;

connecting the first layer of material and the second layer of material with a common base voltage ($V_B$); and connecting each metal gate with a voltage source ($V_A$).

19. The method of claim 16 further comprising the step of forming the plurality of third layers by ion implantation.

20. The method of claim 16 further comprising the steps of forming the first layer of material and the second layer of material using liquid phase epitaxy techniques.

21. The method of claim 16 further comprising the steps of:

forming the first layer from HgCdTe alloys which are sensitive to infrared radiation having a wavelength of approximately 5 μm; and forming the second layer from HgCdTe alloys which are sensitive to infrared radiation having a wavelength of approximately 10 μm.

22. A two-color infrared detector comprising;

(a) first, second and third semiconductor regions, with the first semiconductor region disposed between the second and third semiconductor regions;

(b) the first semiconductor region having first conductivity type material operable to generate electron-hole pairs when struck by infrared radiation having a first wavelength and the second semiconductor region having second conductivity type material operable to generate electron-hole pairs when struck by infrared radiation having a second wavelength, and the third semiconductor region having second conductivity type material operable to generate electron-hole pairs when struck by infrared radiation having the first wavelength;

(c) the third semiconductor region formed within the first semiconductor region;

(d) an insulator layer disposed adjacent to the first and third semiconductor regions opposite from the second semiconductor region;

(e) a metal gate disposed adjacent to the insulator layer and opposite from the third semiconductor region for creating a potential well in the third semiconductor region;

(f) an electrically conductive layer disposed on said first semiconductor region, adjacent to said electrical insulator layer and remote from said second semiconductor region;

(g) a first diode junction formed between the first semiconductor region and the second semiconductor region; and (h) a second diode junction formed between the first semiconductor region and the third semiconductor region.

23. A method for fabricating an infrared detector for simultaneously detecting two wavelengths of infrared radiation comprising the steps of:

(a) forming on a substrate a first layer of first conductivity type material operable to generate electron-hole pairs when struck by infrared radiation having a first wavelength;

(b) forming on said first layer of material and remote from said substrate a plurality of second layers of second conductivity type material operable to generate electron-hole pairs when struck by infrared radiation having a second wavelength;

(c) placing an indium bump on each second layer of material;

(d) mating the indium bump on each second layer of semiconductor material with a corresponding indium bump formed on a silicon processor;

(e) removing the substrate from the first layer of material;

(f) forming a plurality of third layers of second conductivity type material at selected locations within the first layer of material;

(g) placing an insulator layer on the first layer of material and the third layers of material opposite from the second layers of material; and (h) placing a plurality of metal gates on the insulator layer with each metal gate aligned vertically with respect to its associated second and third layers of material.

24. The method of claim 23 further comprising the steps of:

connecting the first layer of P-type material with a common base voltage ($V_B$); and connecting each metal gate with a voltage source ($V_A$).

25. The method of claim 23 further comprising the step of forming the plurality of third layers by ion implantation.

26. The method of claim 23 further comprising the steps of forming the first layer of material and the second layer of material using liquid phase epitaxy techniques.

27. The method of claim 23 further comprising the steps of:

forming the first layer from HgCdTe alloys which are sensitive to infrared radiation having a wavelength of approximately 5 µm; and forming the second layers from HgCdTe alloys which are sensitive to infrared radiation having a wavelength of approximately 10 µm.

28. The method of claim 23 further comprising the steps of:

providing a plurality of pairs of metal gates with one gate in each pair disposed on the associated third layer of material and the insulator layer disposed between the one gate and the other gate in each pair; and connecting the other gate with a voltage source ($V_A$).

* * * * *